(12) United States Patent
Miyashita

(10) Patent No.: US 7,999,628 B2
(45) Date of Patent: Aug. 16, 2011

(54) BIAS GENERATION CIRCUIT AND VOLTAGE CONTROLLED OSCILLATOR

(75) Inventor: Daisuke Miyashita, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 160 days.

(21) Appl. No.: 12/555,985

(22) Filed: Sep. 9, 2009

(65) Prior Publication Data

US 2010/0237956 A1  Sep. 23, 2010

(30) Foreign Application Priority Data

Mar. 17, 2009 (JP) ................................ 2009-065289

(51) Int. Cl.
*H03L 1/00* (2006.01)
(52) U.S. Cl. ........ 331/176; 331/185; 331/183; 330/296; 327/536; 327/538; 323/273; 365/189.09
(58) Field of Classification Search .................. 331/183, 331/185, 176; 327/536, 538; 323/273, 316; 365/189.09; 330/296
See application file for complete search history.

(56) References Cited

U.S. PATENT DOCUMENTS

| | | | |
|---|---|---|---|
| 6,356,161 B1 * | 3/2002 | Nolan et al. ................ | 331/176 |
| 6,624,706 B2 * | 9/2003 | Higashi et al. .............. | 331/17 |
| 6,891,443 B2 * | 5/2005 | Rashid ........................ | 331/111 |
| 7,268,633 B2 * | 9/2007 | von Kaenel .................. | 331/17 |
| 7,327,201 B2 | 2/2008 | Miyashita et al. | |
| 2008/0303603 A1 | 12/2008 | Kousai et al. | |

OTHER PUBLICATIONS

Daisuke Miyashita, et al., "A Phase Noise Minimization of CMOS VCOs over Wide Tuning Range and Large PVT Variations", IEEE 2005 Custom Integrated Circuits Conference, Sep. 2005, pp. 583-586.

* cited by examiner

*Primary Examiner* — Arnold Kinkead
(74) *Attorney, Agent, or Firm* — Oblon, Spivak, McClelland, Maier & Neustadt, L.L.P.

(57) ABSTRACT

This invention includes a bias origination section configured to originate an original bias voltage; a comparison section configured to compare the original bias voltage and a comparison voltage, and output a comparison result; a resistive divider section composed by a resistance circuit including a variable resistor section having a resistor and a switch, and configured to generate the comparison voltage; a bias decision control section configured to determine bias decision data for controlling a resistance value of the variable resistor section so as to bring the comparison voltage close to the original bias voltage, based on a comparison result of the comparison section; and a storage section configured to hold the bias decision data and also output the comparison voltage as a bias voltage by controlling a resistance value of the variable resistor section based on the held bias decision data, thereby generating a low-noise bias with a small area.

20 Claims, 3 Drawing Sheets

BIAS GENERATION CIRCUIT AND VOLTAGE CONTROLLED OSCILLATOR

CROSS-REFERENCE TO RELATED APPLICATION

This application is based upon and claims the benefit of priority from the prior Japanese Patent Application No. 2009-65289 filed in Japan on Mar. 17, 2009; the entire contents of which are incorporated herein by reference.

BACKGROUND OF THE INVENTION

1. Field of the Invention

The present invention relates to a bias generation circuit and a voltage controlled oscillator that are suitable for a large-scale integrated circuit for radio communication.

2. Description of Related Art

Conventionally, in an LSI for radio communication, various bias voltages (or currents) are supplied to the circuit. For example, in order to decide the operating point of a transistor, a bias voltage is applied to a gate of the transistor. Further, for example, a bias current is supplied by a current source to a common source of transistors that configure a differential amplifier. A bias generation circuit that generates this kind of bias can be composed by variable resistors that divide a power supply voltage.

Variations in the characteristics of transistors occur due to temperature changes, fluctuations in the power supply voltage, or the influence of variations in manufacturing. It is possible to reduce the influence of such variations in the characteristics by adjusting a bias that is supplied to a circuit. However, in a bias generation circuit of a simple configuration that uses only variable resistors, it is not possible to automatically adjust a bias according to variations in the characteristics of elements. Therefore, in general, a bias generation circuit is configured by a comparatively complicated circuit that uses many elements including transistors.

For example, Japanese Patent Application Laid-Open Publication No. 2005-94635 discloses a bias circuit of a power amplifier that is configured to prevent a bias current that has been set once from changing due to changes in the ambient temperature.

Thus, because a bias generation circuit has a complicated circuit configuration that includes transistors, in some cases a bias generation circuit becomes a major noise source within the overall circuit. A transistor generates flicker noise (1/f noise) that is inversely proportional to the frequency. Due to the influence thereof, flicker noise also mixes with a bias voltage (current) that is generated by a bias generation circuit, and adversely affects the operation of a circuit to which the bias is supplied. For example, when noise mixes with a bias current of a voltage controlled oscillator, the oscillation frequency of the voltage controlled oscillator fluctuates.

This kind of bias voltage (or current) noise is generally removed utilizing a low-frequency eliminating filter (low-pass filter). However, since the level of flicker noise increases as the frequency decreases, a low-pass filter with a low cut-off frequency is required to eliminate flicker noise. A low-pass filter includes a resistive element and a capacitive element, and in order to lower the cut-off frequency of a low-pass filter it is necessary to increase the size of these elements when forming the integrated circuit.

That is, a low-pass filter with a large area is required in order to reduce noise occurring in a bias voltage (current), which leads to an increase in the size of an LSI and an increase in costs.

BRIEF SUMMARY OF THE INVENTION

A bias generation circuit according to one aspect of the present invention includes a bias origination section configured to originate an original bias voltage; a comparison section configured to compare the original bias voltage and a comparison voltage, and output a comparison result; a resistive divider section that is composed by a resistance circuit including a variable resistor section composed by resistors and switches, and that is configured to generate the comparison voltage; a bias decision control section configured to determine bias decision data for controlling a resistance value of the variable resistor section so as to bring the comparison voltage close to the original bias voltage, based on a comparison result of the comparison section; and a storage section configured to hold the bias decision data and also output the comparison voltage as a bias voltage by controlling a resistance value of the variable resistor section based on the bias decision data that is held.

A voltage controlled oscillator according to another aspect of the present invention is composed by a resonant circuit configured to decide an oscillation frequency, an oscillator MOS transistor that is connected to the resonant circuit and is configured to output an oscillation output at the oscillation frequency, and a current source that supplies a drain current of the oscillator MOS transistor, the voltage controlled oscillator including: a comparison section configured to compare a direct current voltage based on the drain current with a comparison voltage, and output a comparison result; a resistive divider section that is composed by a resistance circuit including a variable resistor section, and is configured to generate the comparison voltage; a bias decision control section configured to determine bias decision data for controlling a resistance value of the variable resistor section so as to bring the comparison voltage close to a direct current voltage that is based on the drain current, based on a comparison result of the comparison section; a storage section configured to hold the bias decision data and also output the comparison voltage from the resistive divider section by controlling a resistance value of the variable resistor section; and an operational amplifier configured to control the current source so as to bring a direct current voltage based on the drain current close to the comparison voltage.

A voltage controlled oscillator according to a further aspect of the present invention is composed by a resonant circuit configured to decide an oscillation frequency, an oscillator MOS transistor that is connected to the resonant circuit and is configured to output an oscillation output at the oscillation frequency, and a current source that supplies a drain current of the oscillator MOS transistor, the voltage controlled oscillator including: an amplitude detection section configured to detect an amplitude of an oscillation output that appears in a drain of the oscillator MOS transistor; a first operational amplifier configured to generate a first control signal for controlling the current source so that a detection result of the amplitude detection section matches a predetermined reference voltage; a comparison section configured to compare a direct current voltage based on the drain current with a comparison voltage and output a comparison result; a resistive divider section that is composed by a resistance circuit including a variable resistor section, and is configured to generate the comparison voltage; a bias decision control section configured to determine bias decision data for controlling a resistance value of the variable resistor section so as to bring the comparison voltage close to a direct current voltage that is based on the drain current, based on a comparison result of the comparison section; a storage section configured to hold the bias decision data and to output the comparison voltage from the resistive divider section by controlling a resistance value of the variable resistor section; a second operational amplifier configured to generate a second control signal for controlling the current source so that a direct current voltage based on the drain current matches the comparison voltage; and a switching section configured to selectively provide the first or second control signal to the current source.

DETAILED DESCRIPTION OF THE INVENTION

Figure 1:
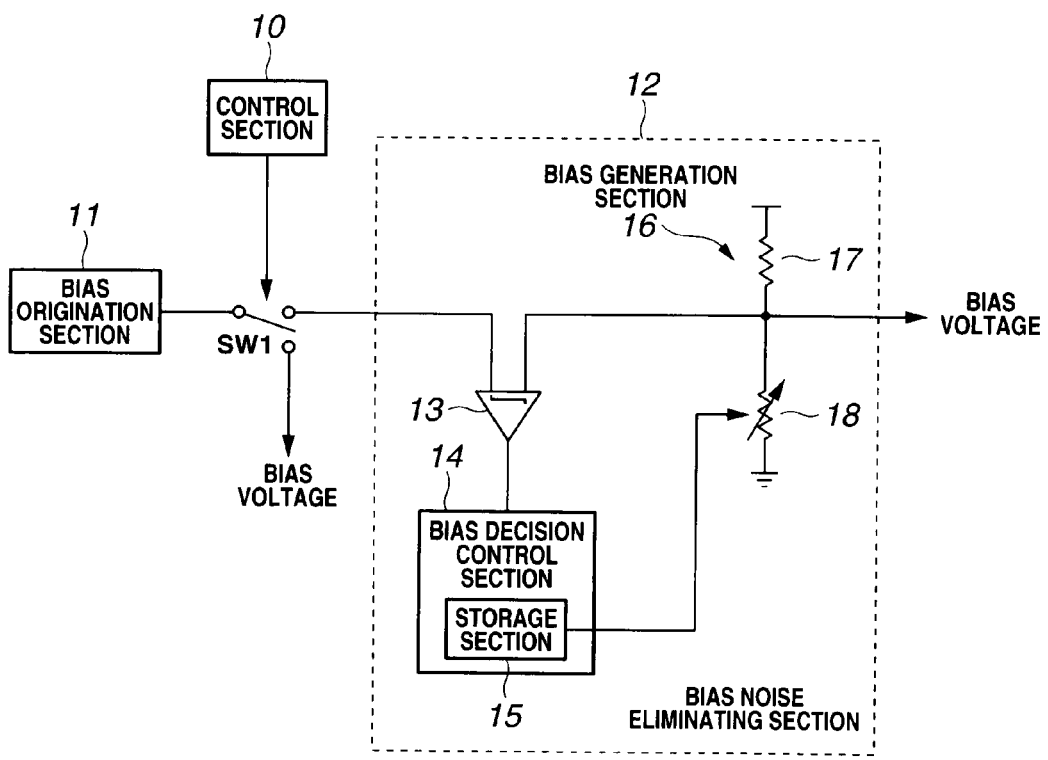
FIG. 1 is a block diagram that illustrates a bias generation circuit according to a first embodiment of the present invention.

Hereunder, embodiments of the present invention are described in detail referring to the drawings.

First Embodiment

FIG. 1 is a block diagram that illustrates a bias generation circuit according to the first embodiment of the present invention. In FIG. 1, a bias origination section 11 originates a bias voltage to be supplied to various elements or circuits and the like. The bias origination section 11 originates a bias voltage that is required in order to stably drive elements and circuits and the like in accordance with temperature changes, power supply voltage fluctuations, and variations in manufacturing of the elements. For example, a case is assumed in which a bias voltage from the bias origination section 11 is utilized as a gate bias voltage of a transistor (not shown). In this case, for example, the bias origination section 11 is configured to be capable of originating a bias voltage such that a transconductance (gm) of a transistor to which a bias voltage is supplied is constant, irrespective of fluctuations in the power supply voltage, temperature changes, manufacturing variations and the like.

A bias voltage (hereunder, referred to as "original bias voltage") originated by the bias origination section 11 is outputted via a switch SW1. The switch SW1 is controlled by a control section 10, and switches an output destination of an original bias voltage from the bias origination section 11. More specifically, the control section 10 controls the switch SW1 to supply the original bias voltage as a bias voltage directly to a target element or circuit or the like, or to supply the original bias voltage to a target element or circuit or the like after noise is eliminated by a bias noise eliminating section 12.

The bias noise eliminating section 12 includes a comparator 13, a bias decision control section 14, and a bias generation section 16. The bias generation section 16 is composed by a resistive divider circuit that includes a resistor 17 and a variable resistor section 18. One end of the resistor 17 is connected to a power source terminal, and the other end is connected to a reference potential point via the variable resistor section 18. A power supply voltage that appears at the power source terminal is divided by the resistor 17 and the variable resistor section 18, and a voltage that is based on a resistance ratio between a resistance value of the resistor 17 and a resistance value of the variable resistor section 18 appears at a connection point of the resistor 17 and the variable resistor section 18.

The bias generation section 16 is configured to output a voltage that appears at the connection point of the resistor 17 and the variable resistor section 18 as a bias voltage to a target element or circuit or the like. Accordingly, a desired bias voltage can be obtained by appropriately setting the resistance value of the variable resistor section 18. Since the bias voltage is generated based on the resistance of the resistor 17 and the variable resistor section 18, the flicker noise level is sufficiently low. Further, since the bias voltage is a value that is in accordance with the resistance ratio between the resistor 17 and the variable resistor section 18, the resistance value of the resistor 17 and the variable resistor section 18 may be set to a comparatively small value. Since occurrence of noise in a resistor increases or decreases in accordance with a resistance value, by designing the resistance value to a small value it is possible to decrease the bias voltage noise still further.

Figure 2:
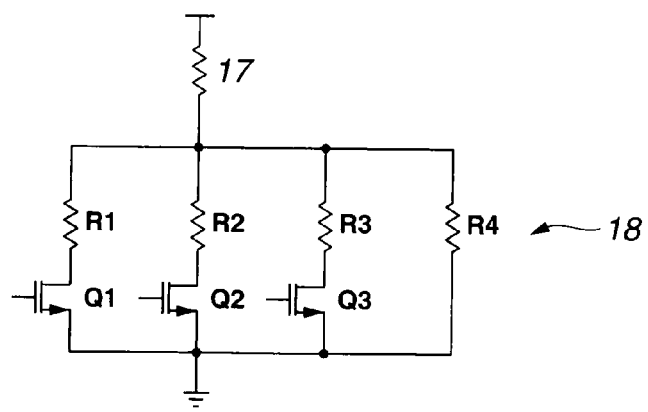
FIG. 2 is a circuit diagram that illustrates an example of the specific configuration of a bias generation section 16.

FIG. 2 is a circuit diagram that illustrates an example of the specific configuration of the bias generation section 16. According to the present embodiment, the variable resistor section 18 is configured by connecting a plurality of series circuits in parallel between resistors and MOS transistors constituting a switch. More specifically, in the example shown in FIG. 2, a series circuit including a resistor R1 and a transistor Q1, a series circuit including a resistor R2 and a transistor Q2, a series circuit including a resistor R3 and a transistor Q3, and a resistor R4 are mutually connected in parallel to constitute the variable resistor section 18.

Although the example shown in FIG. 2 illustrates a parallel configuration, for example, a series configuration or any configuration can be employed as the variable resistor section 18 as long as the resistance is variable.

Bias decision data is supplied from a bias decision control section 14, described later, to the transistors Q1 to Q3. A combined resistance value of the variable resistor section 18 is determined by turning the transistors Q1 to Q3 on and off based on the bias decision data. By setting the respective resistance values R1 to R3 of the resistors R1 to R3 to mutually different values and appropriately turning on and off the transistors Q1 to Q3, the variable resistor section 18 shown in FIG. 2 can take eight kinds of values as the combined resistance value. As a result, the bias generation section 16 that uses the variable resistor section 18 shown in FIG. 2 can generate eight kinds of bias voltages.

The comparator 13 is supplied with an original bias voltage that the bias origination section 11 originates and a bias voltage that appears at a connection point of the resistor 17 and the variable resistor section 18. The comparator 13 compares the two inputs, and outputs a comparison result to the bias decision control section 14.

The bias decision control section 14 receives the comparison result from the comparator 13, determines bias decision data that controls the variable resistor section 18 so as to bring a bias voltage generated at the bias generation section 16 close to the original bias voltage, and stores the bias decision data in a storage section 15. The bias decision data stored in the storage section 15 is supplied to the variable resistor section 18 to set the combined resistance value of the variable resistor section 18.

More specifically, the bias decision control section 14 according to the present embodiment determines bias decision data so as to generate in the bias generation section 16 a voltage that duplicates an original bias voltage at a predetermined time from the bias origination section 11.

In this connection, the bias decision control section 14 is configured to determine the bias decision data at a predetermined timing, and thereafter hold the determined bias decision data in the storage section 15. Further, a configuration may also be adopted in which the bias decision control section 14 determines bias decision data for every appropriate time.

In this connection, the bias decision control section 14 is capable of performing sufficiently high speed operations in comparison to the frequency of flicker noise, and is capable of determining bias decision data without receiving the influence of flicker noise.

Figure 3:
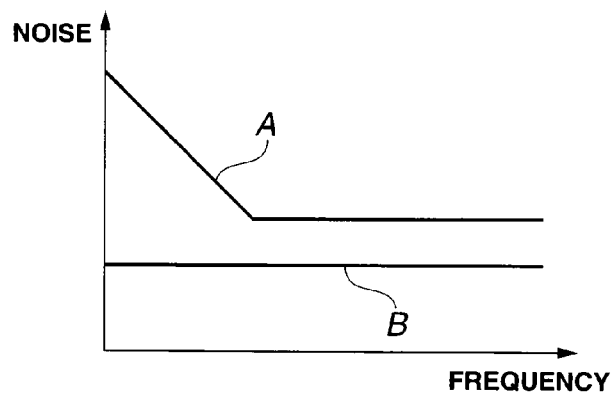
FIG. 3 is a graph that illustrates noise characteristics of a bias voltage, in which the horizontal axis represents the frequency and the vertical axis represents the level.

FIG. 3 is a graph that illustrates noise characteristics of a bias voltage, in which the horizontal axis represents the frequency and the vertical axis represents the RMS (root mean square) noise voltage level. A characteristic A in FIG. 3 illustrates a noise characteristic of the original bias voltage from the bias origination section 11. A characteristic B in FIG. 3 illustrates a noise characteristic of a bias voltage that the bias generation section 16 generates.

The bias origination section 11 originates a bias voltage that is supplied to a target element or circuit or the like. The bias origination section 11 changes the bias voltage so as to optimize the bias voltage depending on temperature changes, fluctuations in the power supply voltage, manufacturing variations, and the like. However, flicker noise is comparatively large in a bias voltage from the bias origination section 11, particularly in a low frequency region.

In a case that requires complicated operations such as in the bias origination section 11, it is necessary to decide the circuit configuration and the sizes of each transistors included in the bias origination section 11 in accordance with the characteristics required for each transistor. Consequently the level of flicker noise of each transistor tends to be large. Therefore, as shown by the characteristic A in FIG. 3, large noise is superimposed on the original bias voltage, particularly at a low frequency.

In contrast, in a case in which a transistor is merely used as a switch, as in the case of transistors Q1 to Q3 included in the variable resistor section 18, there is a high level of freedom in designing the transistors, and flicker noise can be reduced by increasing the size of the transistors. Thus, the influence of noise can be sufficiently lessened by the variable resistor section 18, and as shown by the characteristic B in FIG. 3, the noise level of the bias voltage is sufficiently low irrespective of the frequency thereof. In this connection, although it is also possible to use an analog circuit to form the variable resistor section 18, in that case the influence of noise can not be reduced sufficiently.

The control section 10 controls the switch SW1 at a predetermined timing to apply a bias voltage from the bias origination section 11 to the bias noise eliminating section 12 as an original bias voltage. The bias noise eliminating section 12 generates a bias voltage for which noise has been eliminated from the original bias voltage by the bias decision control section 14, and supplies the bias voltage to a target element or circuit or the like.

The bias decision control section 14, for example, may determine bias decision data by a similar method to that of a flash-type A/D converter, or may determine bias decision data by a similar method to that of a successive approximation register (SAR) A/D converter.

Figure 4:
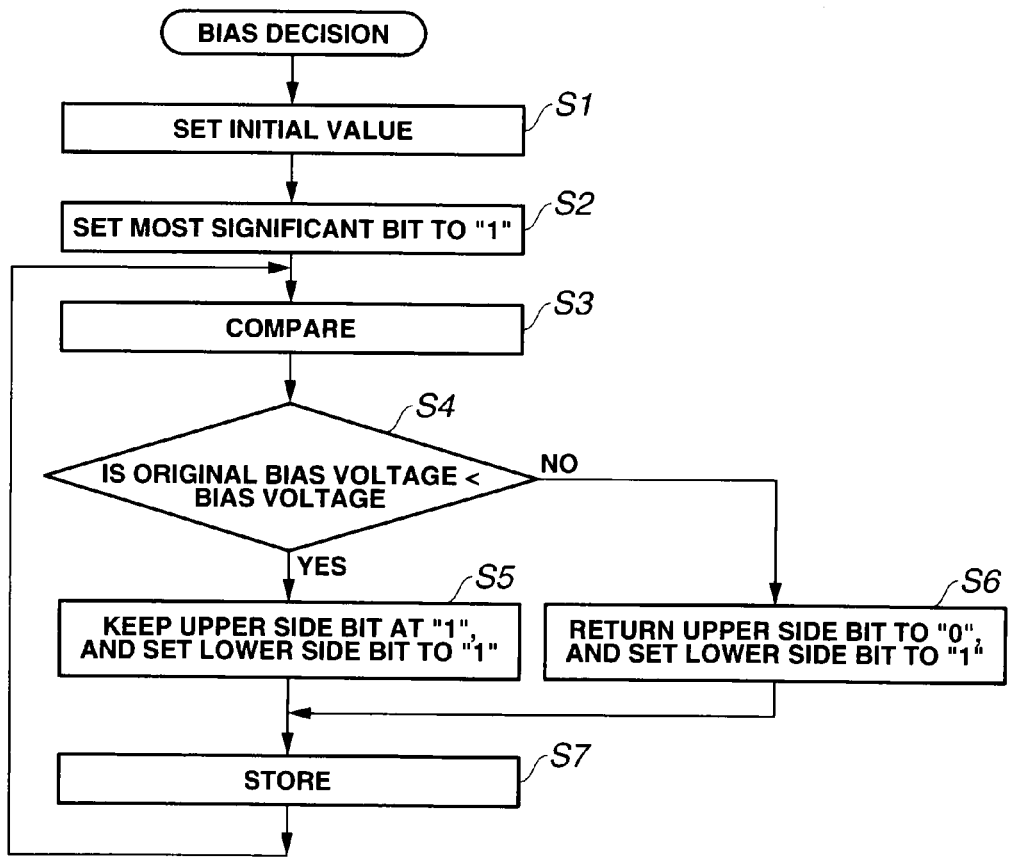
FIG. 4 is a flowchart for describing operations of the first embodiment of the present invention.

Next, operations of the embodiment configured in this manner are described referring to the flowchart shown in FIG. 4. FIG. 4 is a view that illustrates the flow of operations of the bias noise eliminating section 12 in a case in which the bias decision control section 14 determines bias decision data by a similar method to that of a successive approximation register A/D converter.

The example in FIG. 4 is one in which the level of a voltage applied to the gates of the transistors Q1 to Q3 of the variable resistor section 18 is stored in the storage section 15 by means of a logical value. More specifically, when a logical value of the bias decision data stored in the storage section 15 is "1", a gate voltage of High level is applied to each transistor Q1 to Q3, and when the logical value is "0" a gate voltage of Low level is applied to the transistors Q1 to Q3. The bias decision data is composed by bits corresponding to the transistors Q1 to Q3, respectively. The bias decision control section 14 assigns the most significant bit of the bias decision data to the resistor for which the bias voltage is to be decreased most among the resistors R1 to R3 of the variable resistor section 18, and assigns the lower bits to resistors in accordance with the contribution of the relevant resistor to decreasing the bias voltage. In this connection, for the example shown in FIG. 2 the bias decision data includes three bits.

First, the bias decision control section 14 initializes to "0" each bit of the bias decision data at step S1. More specifically, in this case the variable resistor section 18 is at the maximum resistance value, and at the bias generation section 16 the maximum bias voltage is obtained based on the power supply voltage and the resistors 17 and R4.

Next, the bias decision control section 14 sets the most significant bit of the bias decision data to "1" (step S2). The bias decision data in which the most significant bit is "1" and other bits are "0" is stored in the storage section 15.

The bias decision data stored in the storage section 15 is supplied to the transistors Q1 to Q3 of the variable resistor section 18. A voltage of High level is applied to a transistor connected to a resistor for which the bias voltage is to be decreased the most, and the combined resistance of the variable resistor section 18 is based on the resistor in question and the resistor R4. As a result, a bias voltage from the bias generation section 16 decreases.

In this state, the comparator 13 compares the original bias voltage and the bias voltage from the bias generation section 16 (step S3). The bias decision control section 14 decides whether or not the original bias voltage is smaller than the bias voltage based on the comparison result of the comparator 13 (step S4).

When the original bias voltage is smaller, the bias decision control section 14 keeps the most significant bit at "1" and sets the next lower bit to "1" (step S5). This bias decision data is stored in the storage section 15 (step S7). When the variable resistor section 18 is controlled based on the stored bias decision data, the bias voltage decreases to close to the original bias voltage, and in some cases becomes less than the original bias voltage.

In contrast, when it is determined in step S4 that the original bias voltage is larger than the bias voltage, the bias decision control section 14 returns the most significant bit to "0" and sets the next lower bit to "1" (step S6). When this bias decision data is stored in the storage section 15 and the variable resistor section 18 is controlled, the bias voltage increases to close to the original bias voltage, and in some cases becomes greater than the original bias voltage.

Thereafter, steps S3 to S7 are repeatedly executed in a similar manner to determine the data of the lower bits in sequence from the most significant bit of the bias decision data until the data of the least significant bit is decided. By performing control to turn the transistors Q1 to Q3 on and off using the bias decision data that is determined in this manner, the bias voltage can be made to close to the original bias voltage.

The bias voltage from the bias generation section 16 is a value that is close to the original bias voltage from the bias origination section 11, and since the bias generation section 16 obtains a bias voltage by resistive dividing, the noise level is low and flat.

A high level of noise is mixed with the original bias voltage in a low frequency region. When considered in terms of time, the original bias voltage undergoes relatively large levels of fluctuations at a low frequency. If a case is supposed in which this kind of original bias voltage is utilized for a bias current of a voltage controlled oscillator, a phase noise of the oscillation output of the voltage controlled oscillator will increase due to the low-frequency noise generated in the bias current, and the frequency will fluctuate to a comparatively large degree.

In contrast, in a bias voltage that is generated by the bias generation section 16, the noise in a low frequency region is sufficiently small. Accordingly, by utilizing this kind of low-noise bias voltage for a voltage controlled oscillator it is possible to stabilize the oscillation frequency of the voltage controlled oscillator.

However, the bias generation section 16 by itself cannot change a bias voltage in accordance with temperature changes, fluctuations in the power supply voltage, manufacturing variations, and the like. Therefore, according to the present embodiment, the bias decision control section 14 obtains a bias voltage by eliminating noise from the original bias voltage at an appropriate timing. The bias origination section 11 originates an original bias voltage in accordance with temperature changes, fluctuations in the power supply voltage, manufacturing variations, and the like, and it is thus possible for the bias generation section 16 to generate a bias voltage that has been changed in accordance with temperature changes, fluctuations in the power supply voltage, manufacturing variations and the like.

For example, in a case in which a circuit that is the bias voltage supply target is a transmission circuit, a configuration may be adopted in which the bias decision control section 14 generates a bias voltage by eliminating noise from the original bias voltage immediately prior to transmitting and, for example, supplies the bias voltage to the voltage controlled oscillator.

Further, for example, the control section 10 may be configured to apply the original bias voltage to the bias noise eliminating section 12 for only a period from immediately before a transmitting time until the transmission ends. In general, a time period in which a voltage controlled oscillator oscillates for the purpose of transmission is comparatively short, and it is considered that changes such as a temperature rise during that period are extremely small. Accordingly, by adopting a configuration in which the control section 10, for example, applies the original bias voltage to the bias noise eliminating section 12 only in a predetermined period, it is possible to generate a bias voltage that is little influenced by temperature changes at the bias generation section 16.

For example, in a Bluetooth transmitter, the oscillation frequency is changed for the purpose of frequency hopping. At the time of a frequency change, transmission is not performed during a period until the oscillation frequency of the voltage controlled oscillator "locks". Hence, for example, a configuration may be adopted in which the bias decision control section 14 determines bias decision data and generates a bias voltage in that period.

Further, the bias decision control section 14 may also be configured to determine bias decision data only one time, which is at the time of activating the apparatus, and thereafter generate a bias voltage based on the bias decision data that is determined at that time. Even in this case, it is possible to compensate for manufacturing variations.

Thus, according to the present embodiment, by utilizing a bias origination section to originate a bias voltage that corresponds to temperature changes, fluctuations in a power supply voltage, manufacturing variations and the like, determining a value of the bias voltage at a predetermined timing, and restoring a bias voltage value by resistive dividing, a stable bias voltage is obtained that has a reduced level of flicker noise and that corresponds to temperature changes, fluctuations in a power supply voltage, manufacturing variations and the like. Since the area of an additional circuit such as a comparator or a bias decision control section is sufficiently small, and there is no necessity to include a low-pass filter or the like with a large area since the cut-off frequency is low because of the elimination of bias voltage noise, a semiconductor integrated circuit that includes a bias generation circuit that generates a low-noise bias voltage with a small area can be obtained.

In this connection, the bias generation circuit according to the present embodiment is a circuit that generates a bias voltage. A bias current can be obtained, for example, by controlling a bias voltage that is applied to a gate of one transistor. Accordingly, although a description regarding generation of a bias current is omitted in the present embodiment, it is clear that a bias current from which noise has been eliminated can be easily generated by using the bias voltage of FIG. 1.

Further, according to the above described embodiment, although an example is described in which a bias generation circuit generates a bias voltage for making the transconductance (gm) of a transistor element constant, the present invention is not limited thereto. For example, a configuration may be adopted so as to generate a bias voltage for making a drain current of a transistor element constant.

Second Embodiment

Figure 5:
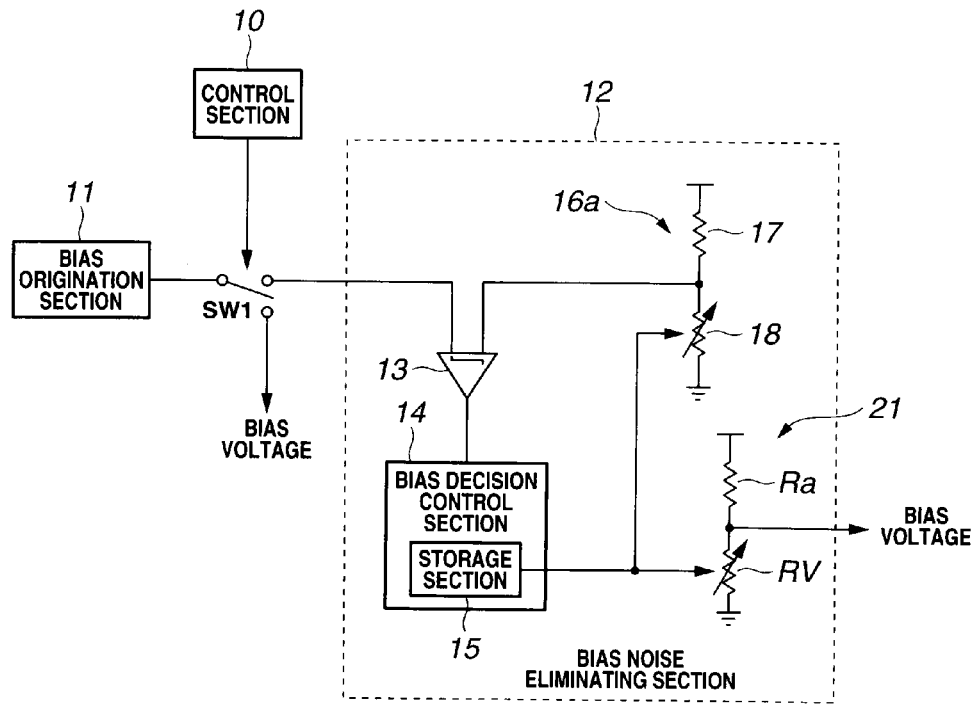
FIG. 5 is a circuit diagram that illustrates a second embodiment of the present invention.

FIG. 5 is a circuit diagram that illustrates a second embodiment of the present invention. Components shown in FIG. 5 that are the same as the components in FIG. 1 are denoted by the same reference numerals, and a description of these components is omitted hereunder.

The present embodiment differs from the first embodiment in that a resistive divider section 16a is adopted instead of the bias generation section 16, and an output section 21 is added. The resistive divider section 16a has the same configuration as that of the bias generation section 16. The output section 21 is composed by a resistor Ra and a variable resistor section RV that are connected in series between a power source terminal and a reference potential point. The variable resistor section RV is configured so that a resistance value thereof is decided based on bias decision data from the bias decision control section 14. For example, the output section 21 is configured in the same manner as the bias generation section 16, and generates a bias voltage based on bias decision data from the bias decision control section 14.

The bias generation section 16 shown in FIG. 1 has a function that generates a bias voltage that is supplied to a target element or circuit or the like, and also has a comparison voltage generation function that generates a voltage that is compared with an original bias voltage in order to determine bias decision data. In contrast, according to the present embodiment, since a bias voltage is generated by the output section 21, it is sufficient for the resistive divider section 16a to have only a comparison voltage generation function.

Accordingly, it is not necessary to provide the same configuration for the resistive divider section 16a and the output section 21. For example, it is sufficient to make the resistance ratio between the resistor Ra and the variable resistor section RV of the output section 21 match the resistance ratio between the resistor R17 and the variable resistor R18, and it is not necessary to make the respective resistance values of the resistor Ra and the variable resistor section RV of the output section 21 match the resistance values of the resistor R17 and the variable resistor R18.

For example, a case may be considered in which the respective resistance values of the resistor Ra and the variable resistor section RV of the output section 21 are made less than the resistance values of the resistor R17 and the variable resistor R18. In this case, in a period in which bias decision data is determined, it is possible to suppress power consumption by means of a comparatively large resistance value of the resistive divider section 16a, and also lessen the influence of noise by means of a comparatively small resistance value of the output section 21.

Further, since it is sufficient for the resistive divider section 16a to have only a comparison voltage generation function, a configuration need not necessarily be adopted in which a plurality of series circuits between a resistor and a switch are connected in parallel, and for example, it is also possible to adopt a configuration that includes an analog circuit.

The remaining configuration and operational advantages are the same as those of the first embodiment.

Thus, according to the present embodiment, it is possible to enhance the degree of design freedom in comparison to the first embodiment, and also generate a low-noise bias voltage while suppressing power consumption.

In this connection, as described above, when low-frequency noise mixes with a bias current of a voltage controlled oscillator, the phase noise of the oscillation output of the voltage controlled oscillator increases and frequency fluctuations occur. Therefore, by utilizing a bias generation circuit described in the above embodiments to generate a bias current of a voltage controlled oscillator, a stable oscillation frequency can be obtained. Thus, the bias generation circuit is extremely useful.

Third Embodiment

Figure 6:
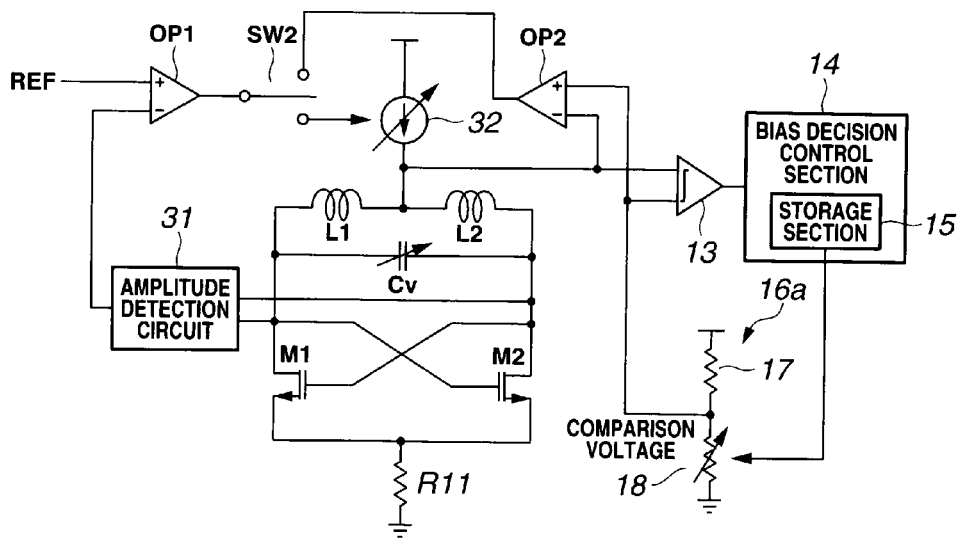
FIG. 6 is a circuit diagram that illustrates a third embodiment of the present invention.

FIG. 6 is a circuit diagram that illustrates a third embodiment of the present invention. FIG. 6 shows a voltage controlled oscillator that is suitable for large scale integration. Components shown in FIG. 6 that are the same as the components in FIG. 2 are denoted by the same reference numerals, and a description of these components is omitted hereunder.

In a voltage controlled oscillator, if a bias current is merely controlled to a desired value, the oscillation amplitude will change each time the oscillation frequency changes. With regard to this problem, Japanese Patent Application Laid-Open Publication No. 2006-197571 discloses technology that makes an oscillation amplitude constant irrespective of the oscillation frequency.

However, in the invention of the aforementioned publication also, low-frequency noise mixes with a bias current as the result of flicker noise occurring in an oscillation transistor and the noise of a reference voltage (REF) for bias current control. As a result, a phase noise of the oscillation output increases.

According to the present embodiment, in a voltage controlled oscillator in which an oscillation amplitude is constant irrespective of the oscillation frequency, it is possible to suppress a low-frequency noise of a bias current and suppress a phase noise of the oscillation output.

In FIG. 6, a voltage controlled oscillator has coils L1 and L2, a variable capacitive element CV such as a varactor, and oscillation transistors M1 and M2. A current source 32 is connected between the power source terminal and a connection point of the coils L1 and L2. A drain current (bias current) is supplied from the current source 32 to the connection point of the coils L1 and L2.

One end of the series circuit including coils L1 and L2 is connected to a drain of the oscillation transistor M1, and the other end is connected to the drain of the oscillation transistor M2. Sources of the transistors M1 and M2 forming a differential pair are commonly connected, and a connection point thereof is connected to a reference potential point via a resistor R11. The drain of the transistor M1 is connected to a gate of the transistor M2. The drain of the transistor M2 is connected to a gate of the transistor M1.

In the voltage controlled oscillator shown in FIG. 6, an oscillation frequency is determined by an LC resonant circuit formed by the coils L1 and L2 and the variable capacitive element CV. The oscillation output appears in the drains of the oscillation transistors M1 and M2. The voltage controlled oscillator is configured such that, by changing a capacitance value of the variable capacitive element CV based on a reference frequency, the oscillation frequency matches a frequency corresponding to the reference frequency.

The drains of the oscillation transistors M1 and M2 are connected to an amplitude detection circuit 31. The amplitude detection circuit 31 detects the oscillation amplitude and outputs an amplitude detection voltage in accordance with the oscillation amplitude to a negative input terminal of an operational amplifier OP1. A reference voltage (REF) as a reference for a control voltage of the current source 32 is supplied to a positive input terminal of the operational amplifier OP1. The operational amplifier OP1 generates a control voltage so that the amplitude detection voltage matches the reference voltage, and applies the control voltage to the current source 32 via the switch SW1 to perform feedback control. Thereby, the current source 32 flows a bias current so as to make the oscillation amplitude constant irrespective of the oscillation frequency.

However, as described above, a low-frequency noise mixes with the bias current due to flicker noise of the oscillation transistors M1 and M2 and noise of the reference voltage (REF). According to the present embodiment, the comparator 13, the bias decision control section 14, the resistive divider section 16a, an operational amplifier OP2 and a switch SW2 are provided in order to eliminate this kind of low-frequency noise of a bias current.

A direct current voltage that appears at a connection point of coils L1 and L2 and a comparison voltage that is generated by the resistive divider section 16a are supplied to the comparator 13. The comparator 13 outputs a comparison result with respect to the two inputs to the bias decision control section 14. The bias decision control section 14 determines bias decision data that controls the resistance value of the variable resistor section 18 based on the comparison result, and holds the bias decision data in the storage section 15. Based on the bias decision data from the storage section 15, the resistive divider section 16a outputs a comparison voltage of a voltage value that is close to a direct current voltage that appears at a connection point of the coils L1 and L2 at a predetermined timing.

More specifically, a low-frequency noise produced by the influence of low-frequency noise of the bias current is mixed with the direct current voltage that appears at the connection point of the coils L1 and L2. In contrast, a comparison voltage from the variable resistor section 18 is a voltage obtained by eliminating low-frequency noise of the direct current voltage that appears at the connection point of the coils L1 and L2.

The comparison voltage is supplied to the positive input terminal of the operational amplifier OP2. The direct current voltage that appears at the connection point of the coils L1 and L2 is supplied to the negative input terminal of the operational amplifier OP2. The operational amplifier OP2 supplies a control voltage to the current source 32 via the switch SW2. The control voltage is used for controlling the current source 32 so that the direct current voltage that appears at the connection point of the coils L1 and L2 matches the comparison voltage.

Next, the operations of the embodiment configured in this manner are described.

When changing the oscillation frequency, during a period until the oscillation frequency "locks", the oscillation output is not utilized for communication or the like, or even in a case in which the oscillation output is utilized it is not particularly required for the noise to be small. According to the present embodiment, for example, in a period until the oscillation frequency "locks", bias decision data is obtained to determine a comparison voltage. More specifically, in this period, the switch SW2 supplies the output of the operational amplifier OP1 to the current source 32. The amplitude of an oscillation output that appears in the drains of the transistors M1 and M2 is detected by the amplitude detection circuit 31. The operational amplifier OP1 generates a control voltage that controls the current source 32 so that the amplitude detection voltage matches the reference voltage (REF).

Thus, the current source 32 is controlled by the operational amplifier OP1 to output a drain current such that the amplitude of the oscillation output appearing in the drains of the transistors M1 and M2 is constant. This drain current includes a low-frequency noise.

A direct current voltage appearing at the connection point of the coils L1 and L2 in accordance with the drain current is supplied to the comparator 13. The comparator 13 compares the comparison voltage from the resistive divider section 16a and the direct current voltage appearing at the connection point of the coils L1 and L2, and outputs the comparison result to the bias decision control section 14. The bias decision control section 14 determines bias decision data for controlling the resistance value of the variable resistor section 18 of the resistive divider section 16a so as to make the comparison voltage close to the direct current voltage appearing at the connection point of the coils L1 and L2. The bias decision data is stored in the storage section 15. The variable resistor section 18 decides a resistance value based on the bias decision data that is stored in the storage section 15.

Thus, the comparison voltage from the resistive divider section 16a becomes a value that is close to the value of a direct current voltage that appears at the connection point of coils L1 and L2 at a predetermined timing. More specifically, the comparison voltage becomes a voltage with respect to which low-frequency noise of the direct current voltage that appears at the connection point of coils L1 and L2 has been eliminated.

Next, in order to utilize the oscillation output for communication or the like, the mode shifts to an operation mode in which the level of noise is small. The switch SW2 supplies the output of the operational amplifier OP2 to the current source 32. Further, during this period, the resistive divider section 16a generates a comparison voltage based on bias decision data that is stored in the storage section 15.

The operational amplifier OP2 generates a control voltage that controls the current source 32 such that a direct current voltage appearing at the connection point of the coils L1 and L2 matches the comparison voltage. The low-frequency noise of the comparison voltage is sufficiently suppressed, and the low-frequency noise of the drain current from the current source 32 reaches a sufficiently low level. As a result, an oscillation output of a stable oscillation frequency can be obtained from the drains of the transistors M1 and M2. Further, a control voltage from the operational amplifier OP2 enables the amplitude of the oscillation output to be made constant irrespective of the oscillation frequency, and the voltage controlled oscillator shown in FIG. 6 can output an oscillation output that is at a constant amplitude and for which a phase noise is sufficiently reduced irrespective of the frequency.

In this connection, it is better to adopt a configuration such that the bias decision control section 14 determines bias decision data for at least each change in the oscillation frequency.

According to the present embodiment, a voltage controlled oscillator can be provided that obtains an oscillation output at a constant amplitude and for which a phase noise is sufficiently reduced irrespective of the frequency.

Having described the preferred embodiments of the invention referring to the accompanying drawings, it should be understood that the present invention is not limited to those precise embodiments and various changes and modifications thereof could be made by one skilled in the art without departing from the spirit or scope of the invention as defined in the appended claims.

What is claimed is:
1. A bias generation circuit, comprising:
a bias origination section configured to originate an original bias voltage;
a comparison section configured to compare the original bias voltage and a comparison voltage, and output a comparison result;
a resistive divider section that is comprised by a resistance circuit including a variable resistor section comprised by resistors and switches, and is configured to generate the comparison voltage;
a bias decision control section configured to determine bias decision data for controlling a resistance value of the variable resistor section so as to bring the comparison voltage close to the original bias voltage, based on the comparison result of the comparison section; and
a storage section configured to hold the bias decision data and also output the comparison voltage as a bias voltage by controlling a resistance value of the variable resistor section based on the bias decision data that is held.
2. The bias generation circuit according to claim 1, wherein the variable resistor section of the resistive divider section is comprised by a plurality of resistors and a plurality of transistors comprising the switches that are connected in parallel or in series between a power source terminal and a reference potential point.
3. The bias generation circuit according to claim 2, wherein a transistor comprising the variable resistor section determines a resistance value of the variable resistor section by being turned on or off based on the bias decision data.

4. The bias generation circuit according to claim 1, comprising:
an output section comprised by a resistive divider circuit that is configured with a resistance ratio that is the same as a resistance ratio of the resistive divider section for generating the comparison voltage.

5. The bias generation circuit according to claim 4, wherein the resistive divider circuit comprising the output section has a resistance value that is smaller than a resistance value of a resistance circuit comprising the resistive divider section.

6. The bias generation circuit according to claim 1, wherein the bias decision control section is configured to determine the bias decision data by performing successive approximation between the original bias voltage and the comparison voltage.

7. The bias generation circuit according to claim 4, wherein the bias decision control section is configured to determine the bias decision data by performing successive approximation between the original bias voltage and the comparison voltage.

8. The bias generation circuit according to claim 6, wherein the bias decision control section is configured to set the bias decision data in the storage section, and based on a result of a comparison between a comparison voltage based on the bias decision data that is set and the original bias voltage, to decide the bias decision data in sequence from a most significant bit to a least significant bit of the bias decision data and store the decided data in the storage section.

9. The bias generation circuit according to claim 7, wherein the bias decision control section is configured to set the bias decision data in the storage section, and based on a result of a comparison between a comparison voltage based on the bias decision data that is set and the original bias voltage, to decide the bias decision data in sequence from a most significant bit to a least significant bit of the bias decision data and store the decided data in the storage section.

10. The bias generation circuit according to claim 1, comprising:
a control section configured to switch between whether to output the comparison voltage as the bias voltage or to output the original bias voltage as the bias voltage.

11. The bias generation circuit according to claim 10, wherein the control section is configured to control a switching section that is configured to switch between whether to supply the original bias voltage to the comparison section or to output the original bias voltage as the bias voltage.

12. A voltage controlled oscillator comprised by a resonant circuit configured to decide an oscillation frequency, an oscillator MOS transistor that is connected to the resonant circuit and is configured to output an oscillation output at the oscillation frequency, and a current source that supplies a drain current of the oscillator MOS transistor, the voltage controlled oscillator comprising:
a comparison section configured to compare a direct current voltage based on the drain current with a comparison voltage, and output a comparison result;
a resistive divider section that is comprised by a resistance circuit including a variable resistor section, and is configured to generate the comparison voltage;
a bias decision control section configured to determine bias decision data for controlling a resistance value of the variable resistor section so as to bring the comparison voltage close to a direct current voltage that is based on the drain current, based on the comparison result of the comparison section;
a storage section configured to hold the bias decision data and to output the comparison voltage from the resistive divider section by controlling a resistance value of the variable resistor section; and
an operational amplifier configured to control the current source so as to bring a direct current voltage based on the drain current close to the comparison voltage.

13. A voltage controlled oscillator comprised by a resonant circuit configured to decide an oscillation frequency, an oscillator MOS transistor that is connected to the resonant circuit and is configured to output an oscillation output at the oscillation frequency, and a current source that supplies a drain current of the oscillator MOS transistor, the voltage controlled oscillator comprising:
an amplitude detection section configured to detect an amplitude of the oscillation output that appears in a drain of the oscillator MOS transistor;
a first operational amplifier configured to generate a first control signal for controlling the current source so that a detection result of the amplitude detection section matches a predetermined reference voltage;
a comparison section configured to compare a direct current voltage based on the drain current with a comparison voltage and output a comparison result;
a resistive divider section that is comprised by a resistance circuit including a variable resistor section, and is configured to generate the comparison voltage;
a bias decision control section configured to determine bias decision data for controlling a resistance value of the variable resistor section so as to bring the comparison voltage close to the direct current voltage that is based on the drain current, based on the comparison result of the comparison section;
a storage section configured to hold the bias decision data and to output the comparison voltage from the resistive divider section by controlling a resistance value of the variable resistor section;
a second operational amplifier configured to generate a second control signal for controlling the current source so that a direct current voltage based on the drain current matches the comparison voltage; and
a switching section configured to selectively provide the first or second control signal to the current source.

14. The voltage controlled oscillator according to claim 12, wherein the variable resistor section of the resistive divider section is comprised by a plurality of resistors and a plurality of transistors that are connected in parallel or in series between a power source terminal and a reference potential point.

15. The voltage controlled oscillator according to claim 13, wherein the variable resistor section of the resistive divider section is comprised by a plurality of resistors and a plurality of transistors that are connected in parallel or in series between a power source terminal and a reference potential point.

16. The voltage controlled oscillator according to claim 12, wherein the bias decision control section is configured to determine the bias decision data by performing successive approximation between a direct current voltage based on the drain current and the comparison voltage.

17. The voltage controlled oscillator according to claim 13, wherein the bias decision control section is configured to determine the bias decision data by performing successive approximation between a direct current voltage based on the drain current and the comparison voltage.

18. The voltage controlled oscillator according to claim 16, wherein the bias decision control section is configured to set the bias decision data in the storage section, and based on a comparison result between a comparison voltage based on the bias decision data that is set and a direct current voltage based on the drain current, to decide the bias decision data in sequence from a most significant bit to a least significant bit of the bias decision data and store the decided data in the storage section.

19. The voltage controlled oscillator according to claim 17, wherein the bias decision control section is configured to set the bias decision data in the storage section, and based on a comparison result between a comparison voltage based on the bias decision data that is set and a direct current voltage based on the drain current, to decide the bias decision data in sequence from a most significant bit to a least significant bit of the bias decision data and store the decided data in the storage section.

20. The voltage controlled oscillator according to claim 13, wherein the switching section is configured to provide the first control signal to the current source in a period until the oscillation frequency "locks", and to provide the second control signal to the current source upon the oscillation frequency "locking".

* * * * *